United States Patent [19]

Fushiki

[11] 4,423,389
[45] Dec. 27, 1983

[54] AMPLIFIER WITH POWER SUPPLY SWITCHING

[75] Inventor: Tatsuo Fushiki, Hamamatsu, Japan

[73] Assignee: Nippon Gakki Seizo Kabushiki Kaisha, Hamamatsu, Japan

[21] Appl. No.: 261,050

[22] Filed: May 6, 1981

[30] Foreign Application Priority Data

May 21, 1980 [JP] Japan .................. 55-67450

[51] Int. Cl.³ .............................................. H03F 3/04
[52] U.S. Cl. ................................................. 330/297
[58] Field of Search .................. 330/207 A, 251, 297

[56] References Cited

U.S. PATENT DOCUMENTS 3,486,128 12/1969 Lohrmann .......................... 330/297
4,218,660 8/1980 Carver ................................ 330/297
4,329,657 5/1982 Kamiya .............................. 330/297
4,339,730 7/1982 Yokoyama ......................... 330/297

*Primary Examiner*—James B. Mullins
*Assistant Examiner*—Gene Wan
*Attorney, Agent, or Firm*—Spensley, Horn, Jubas & Lubitz

[57] ABSTRACT

An amplifier arranged so that, when a plurality of power supply voltages supplied to an amplifying device are switched over in accordance with a signal voltage level of the amplifying device, the reference voltage provided for comparison with the abovesaid signal level will follow the fluctuations of the voltage of the lower voltage power supply among said plurality of power supplies, whereby avoiding the starting of operation of the amplifying device in its saturating region to thereby prevent increase in distortion of an output signal.

21 Claims, 5 Drawing Figures

AMPLIFIER WITH POWER SUPPLY SWITCHING

BACKGROUND OF THE INVENTION (a) Field of the Invention

The present invention relates to an amplifier with power supply switching arranged so that power supply voltages which are selectively supplied to an amplifying device are switched in accordance with the voltage level of a signal which is amplified in the amplifier, to attain both improved power efficiency and reduction of signal distortion.

(b) Description of the Prior Art

As power amplifier for use in audio devices and designed to improve power efficiency, there has been known one which is arranged so that power supply voltages supplied to the power amplifier are switched between high level and low level in accordance with the output voltage derived from this power amplifier.

FIG. 1 shows an example of such conventional power amplifier. In the Figure, reference numeral 1 represents an amplifying circuit whose output voltage is supplied to an absolute value circuit 2 and to a loudspeaker 3. Arrangement is provided so that high voltage power supplies 4a, 4b or low voltage power supplies 5a, 5b are brought into connection to said amplifying circuit 1 through respective changeover circuits 6a or 6b.

The switching actions of these changeover circuits 6a and 6b are controlled by a changeover controlling circuit 9 based on an output delivered from a comparator 8 which compares the output voltage of the absolute value circuit 2 with a reference voltage $V_R$ of a reference power supply 7, one end of which is grounded. More specifically, the comparator 8 functions so that, when the absolute value of the output voltage of the amplifying circuit 1 is lower than the reference voltage $V_R$ of said reference power supply 7, the comparator 8 delivers the result of the comparison to the changeover control circuit 9. Whereby, the changeover control circuit 9 controls the respective changeover circuits 6a and 6b to cause the low voltage power supplies 5a and 5b to supply their output voltages to the amplifying circuit 1. Conversely, in case the absolute value of the output voltage of the amplifying circuit 1 is higher than the reference voltage $V_R$, the high voltage power supplies 4a and 4b are then brought into connection to the amplifying circuit 1 via the changeover circuits 6a and 6b, respectively.

In the abovesaid known power amplifier shown in FIG. 1, the reference power supply 7 is arranged so as to use the ground level as its reference voltage. Therefore, this amplifier has the following inconveniences. That is, with regard to the voltages of the low voltage power supplies 5a and 5b, there would arise variation of current supplied to the amplifying circuit 1 from these low voltage power supplies 5a and 5b in accordance with the signal level of the amplifying circuit 1, and such variation of current also serves to the development of voltage fluctuation (voltage drop) of these power supplies. Let us here consider, for example, the instance wherein the voltage level of the output signal undergoes a gradual increment. Such increment of voltage level of the output signal brings about an increase in the current flowing into the amplifying circuit 1 from the low voltage power supplies 5a and 5b, and such increase in the current, in turn, causes a gradual drop of voltages of these power supplies 5a and 5b. Accordingly, in the vicinity of a voltage level at which the output signal voltage is about to reach the reference voltage level $V_R$ of said reference power supply 7, the voltage values of the low voltage power supplies 5a and 5b will drop to such extent as will cause saturation of the amplifying device of the amplifying circuit 1, causing distortion of the signal to develop. Such saturation of the amplifying device could occur also due to a voltage drop during voltage fluctuation of the commercial ac power supply which constitutes the source of power supply to the amplifier.

As a solution to such problems encountered in the past, there can be considered a method of preventing the saturation of the amplifying device by setting, at a sufficiently low level, the reference voltage of the reference power supply 7, so as to advance the timing of switching of connection from the low voltage power supplies over to the high voltage power supplies in case the voltage level of the output signal is rising. Alternatively, the power supply voltage per se are set at sufficiently high levels to thereby prevent the saturation of the amplifying device. These efforts, on the one hand, are effective for the prevention of development of signal distortion. However, on the other hand, they result in an increase in power loss in said amplifying circuit, causing degradation of the power efficiency of the power amplifier.

SUMMARY OF THE INVENTION

It is, therefore, a general object of the present invention to provide an amplifying circuit arranged so that, at the time of switching-over of connection between power supplies to the amplifying device in the amplifying circuit, the power efficiency of said device is not lowered and yet no increase in signal distortion is caused.

A first object of the present invention is to provide an amplifying circuit of the type described above, which is arranged so that, even when the power supply voltages on the low voltage side undergo a drop for any reason, the constituting amplifying device will not become saturated.

A second object of the present invention is to provide an amplifying circuit of the type described above, which is arranged so that, when the power supply voltages on the low voltage side undergo a drop, the reference voltage of the comparing means intended for the changeover of connection of power supplies is caused to drop accordingly.

A third object of the present invention is to provide an amplifying circuit of the type described above, which is arranged so that, in case the output of the amplifying device is a high frequency signal, the changeover timing of connection to the power supply voltages is advanced than in the case of a low frequency output signal, to thereby compensate for a delay in the response speed of the amplifier-constituting members.

A fourth object of the present invention is to provide an amplifying circuit of the type described above, which is arranged so that the changeover signal for causing the changeover of connection of power supplies is temporarily held.

DETAILED DESCRIPTION OF THE PREFERRED EMBODIMENT

The present invention will hereunder be described in detail with respect to a preferred embodiment by giving reference to the accompanying drawings.

Figure 1:
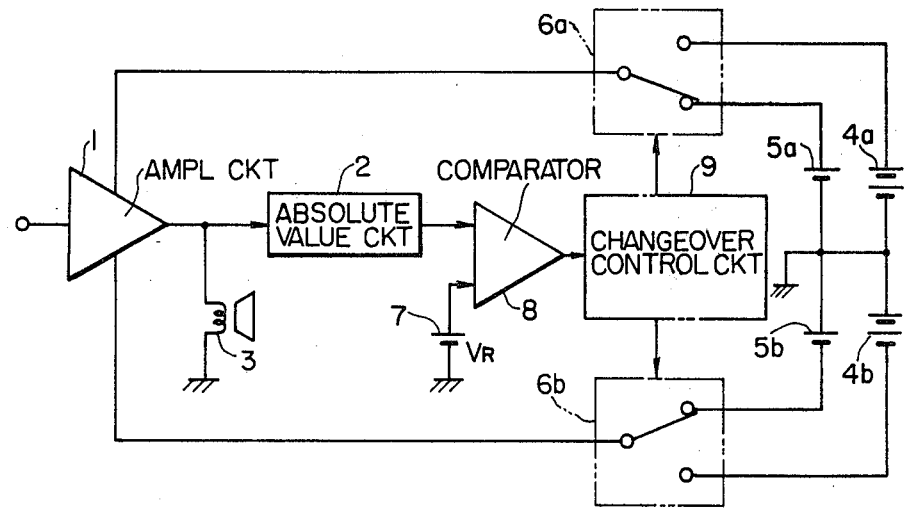
FIG. 1 is a block diagram showing an example of a conventional power amplifier.
Figure 2:
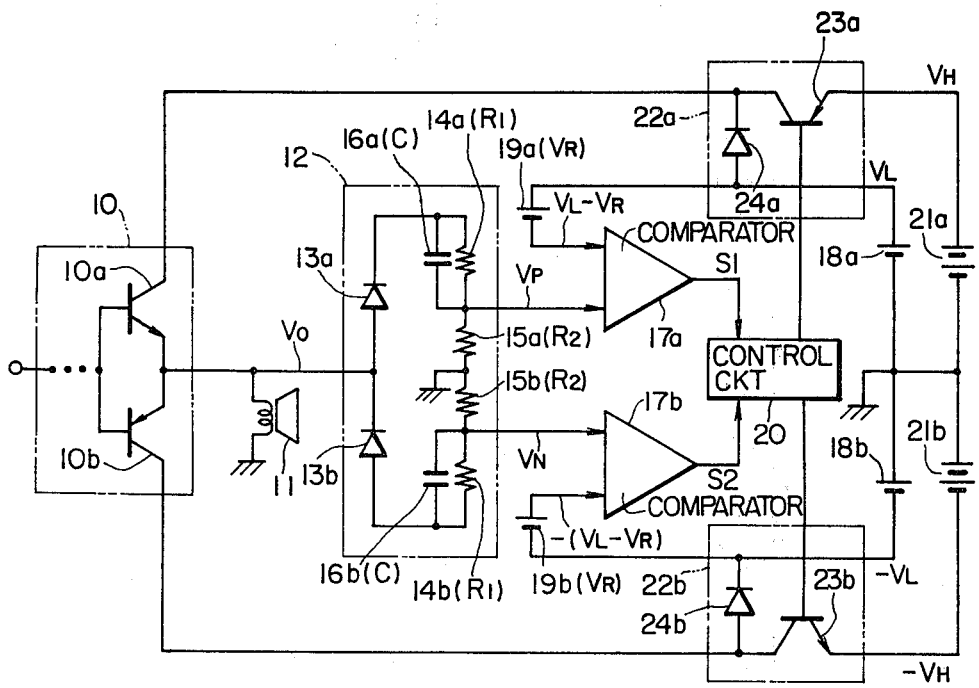
FIG. 2 is a block diagram showing the basic principle of the power amplifier according to the present invention.

FIG. 2 is a diagram showing the basic principle of the power amplifier according to the present invention. In this Figure, reference numeral 10 represents an amplifying circuit. This amplifying circuit 10 has output stage transistors 10a and 10b, and delivers an output voltage $V_O$ derived from the common emitters of these transistors to a loudspeaker 11 and to a rectifying circuit 12.

The rectifying circuit 12 is comprised of a diode 13a which is supplied with a positive voltage from the output voltage $V_O$, a resistor 14a having a resistance value $R_1$ and another resistor 15a having a resistance value $R_2$ both of which are assigned to divide said positive voltage and to output a positive voltage $V_p$, a capacitor 16a having a capacitance value C and being connected in parallel to said resistor 14a to serve as a high-pass filter, a diode 13b supplied with a negative voltage from said output voltage $V_O$, a resistor 14b having the resistance value $R_1$ and another resistor 15b having the resistance value $R_2$ both of which are assigned to divide said negative voltage to output a negative voltage $V_N$, and a capacitor 16b having the capacitance value C and being connected in parallel to said resistor 14b to serve as a high-pass filter. These positive voltage $V_p$ and negative voltage $V_N$ are delivered to comparators 17a and 17b, respectively.

The comparator 17a compares the positive voltage $V_p$ of the rectifying circuit 12 with a reference voltage $(V_L-V_R)$ delivered from a reference power supply 19a having a value $V_R$ ($V_R>0$) whose positive power supply terminal is connected to the positive power supply terminal of a low voltage power supply 18a having a value $V_L$ ($V_L>0$), and delivers an enabling output signal $S_1$ to a control circuit 20 in case the result of said comparison is ($V_p \geq V_L - V_R$). Similarly, the comparator 17b compares the negative voltage $V_N$ of the rectifying circuit 12 with the reference voltage $\{-(V_L-V_R)\}$ delivered from the reference power supply 19b having the value $V_R$ whose negative power supply terminal is connected to the negative power supply terminal of a low voltage power supply 18b having the value $V_L$, and delivers an enabling output signal $S_2$ to the controlling circuit 20 in case the resulting of the comparison is $\{V_N \leq -(V_L - V_R)\}$.

On the other hand, to the amplifying circuit 10 are supplied power supply voltages of said low voltage power supplies 18a, 18b or high voltage power supplies 21a, 21b {these latter two having a value $V_H$ ($V_H>V_L>0$)} via respective changeover circuit 22a or 22b.

The changeover circuit 22a is comprised of a transistor 23a and a diode 24a. When the transistor 23a is conductive, the power supply voltage $V_H$ of the high voltage power supply 21a is supplied to the amplifying circuit 10. Also, when this transistor 23a is non-conductive, the power supply voltage $V_L$ of the low voltage power supply 18a is supplied to the power amplifying circuit 10 through the diode 24a. Similarly, the changeover circuit 22b is comprised of a transistor 23b and a diode 24b. When the transistor 23b is conductive, the power supply voltage ($-V_H$) of the high voltage power supply 21b is supplied to the amplifying circuit 10, whereas when this transistor 23b is non-conductive, the power supply voltage ($-V_L$) of the low voltage power supply 18b is supplied to the amplifying circuit 10 through the diode 24b. In case either one of the enabling output signals $S_1$ and $S_2$ of the comparators 17a and 17b is supplied to the control circuit 20, this latter circuit 20 renders both of the transistors 23a and 23b of the changeover circuits 22a and 22b conductive, whereas in case the output signals $S_1$ and $S_2$ are both non-enabling signals, the control circuit 20 renders both of the transistors 23a and 23b non-conductive.

Next, the operation of this power amplifier will be described.

To begin with, consideration will be made to the instance wherein the output voltage $V_O$ of the amplifying circuit 10 is positive. Firstly, the relationship between the output voltage $V_O$ and the positive voltage $V_p$ is as follows:

$$V_p = \frac{R_2}{R_2 + R_1//Z_c} \cdot V_0, \tag{1}$$

provided, however, the forward voltage drop of the diode 13a is disregarded, wherein $R_1 //Z_c$ is $R_1/(1+j\omega CR_1)$, and $\omega = 2\pi f$.

And, in case the output voltage $V_O$ is:

$$V_0 < \left(\frac{R_2 + R_1//Z_c}{R_2}\right) \cdot (V_L - V_R),$$

i.e. when $V_p<(V_L-V_R)$, the comparator 17a will not output the enabling signal $S_1$. As a result, the control circuit 20 renders both of the transistors 23a and 23b non-conductive, whereby the power supply voltages $+V_L$ of the low voltage power supplies 18a and 18b are supplied to the amplifying circuit 10 via the diodes 24a and 24b, respectively.

Next, when the output voltage $V_O$ is $$V_0 \geq \left(\frac{R_2 + R_1//Z_c}{R_2}\right) \cdot$$

$(V_l-V_R)$, i.e. when $V_p \geq (V_L-V_R)$, the comparator 17a outputs the enabling signal $S_1$. As a result, the control circuit 20 renders the transistors 23a and 23b conductive, whereby the power supply voltages $\pm V_H$ of the high voltage power supplies 21a and 21b are supplied to the amplifying circuit 10 via the transistors 23a and 23b, respectively.

Let us here consider the instance wherein the power supply voltage $V_L$ of the low voltage power supply 18a has dropped for any reason. When the power supply voltage $V_L$ drops, the reference voltage ($V_L-V_R$) for setting the changeover timing will drop also in accordance with the drop of said power supply voltage $V_L$. As a result, it should be understood that, when the power supply voltage $V_L$ is normal, the enabling output signal $S_1$ is delivered from the comparator 17a when the output voltage $V_O$ assume a certain value, but when the power supply voltage $V_L$ drops as stated above, the comparator 17a already begins to deliver the enabling output signal $S_1$ when the output voltage $V_O$ assumes a value lower than said certain value. Whereby, it is possible to prevent the occurrence of the inconvenience that the amplifying device 10a of the amplifying circuit 10 becomes saturated immediately before the changeover of connections of the power supplies takes place.

Description has been made above with respect to the instance wherein the output voltage $V_O$ is positive. It should be noted here that, even in case of a negative output voltage $V_O$, the comparator 17b, in this case, operates in the similar manner, to control the control circuit 20, whereby the transistors 23a and 23b are controlled.

It has been customary in the prior art amplifier that, as the frequency of the output voltage $V_O$ becomes higher, such constituting elements as the amplifying circuit 10 using amplifying devices, the comparators 17a, 17b, the control circuit 20 and the changeover circuits 22a, 22b begin to exhibit a delay in their response. The capacitors 16a, 16b are provided for making compensation for such delay of their response, and it constitutes a part of high-pass filter. More particularly, the factor $$\left(\frac{R_2}{R_2 + R_1 // Z_c}\right)$$

in said Formula (1) will approach $(R_2/R_2+R_1)$ when the output voltage $V_O$ is of a low frequency, whereas, this factor approaches unity (1) in case it is of a high frequency. From the fact that, as the output voltage $V_O$ approaches closer to a high frequency range, the factor $$\left(\frac{R_2}{R_2 + R_1 // Z_c}\right)$$

approaches unity (1), the high power supply voltages are switched at a point of time earlier than the point of time occurring in case the output voltage $V_O$ is of a low frequency. Thus, it is possible to prevent the saturation of the amplifying devices 10a, 10b due to the delay of response of the constituting members.

Figure 3:
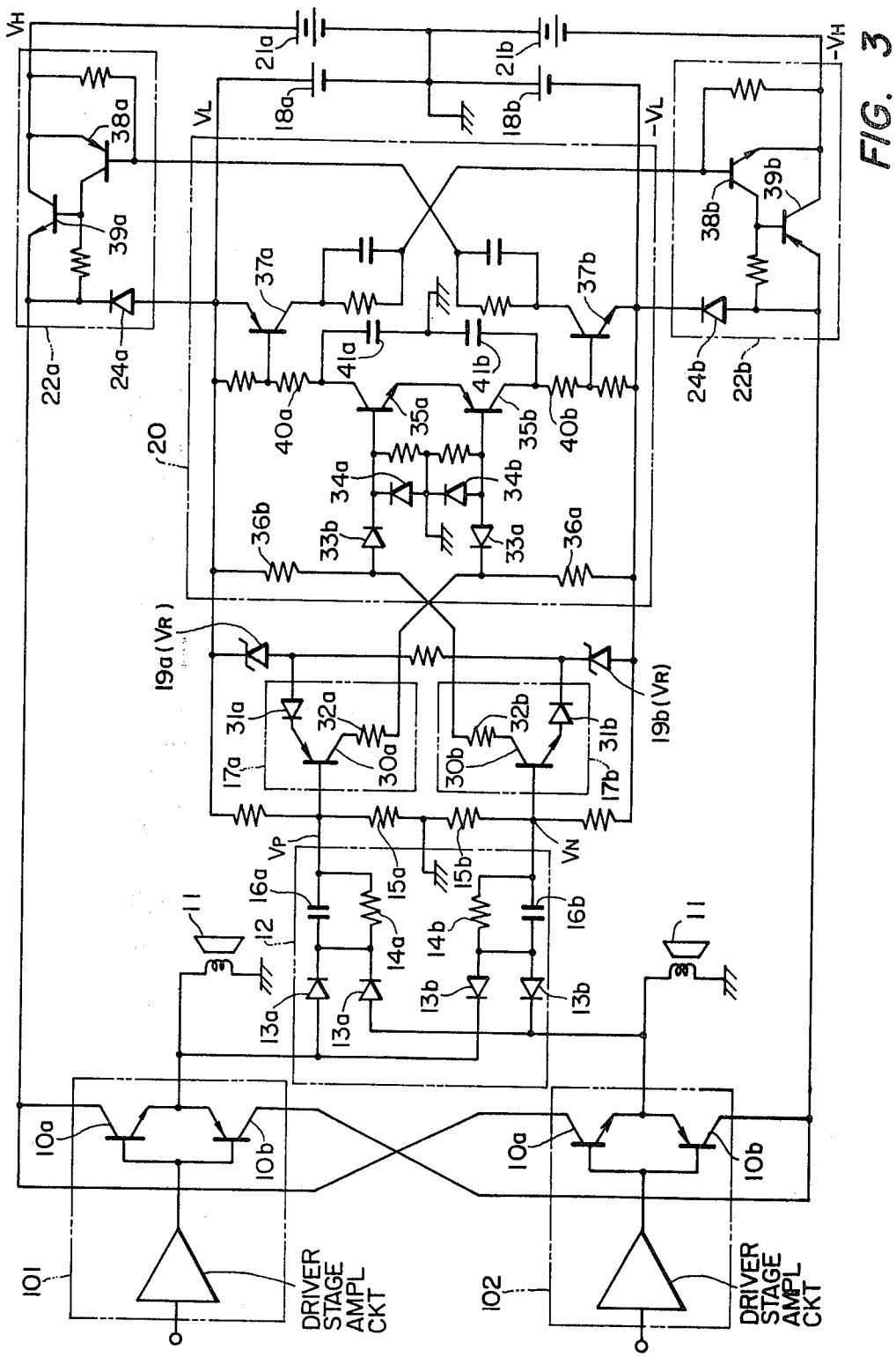
FIG. 3 is a circuit diagram showing a concrete embodiment of the present invention.

FIG. 3 is a concrete embodiment of the present invention, and is applied to a power amplifier for stereo devices. It should be understood that, in FIG. 3, those parts corresponding to those shown in FIG. 2 are given like reference numerals and symbols.

The comparator 17a is comprised of a transistor 30a, a diode 31a and a resistor 32a. In this arrangement, the transistor 30a is rendered non-conductive when the positive voltage $V_p$ supplied from the rectifying circuit 12 and applied to the base of this transistor exceeds the level of the reference voltage $\{V_L - V_R - V_D - V_{BE}\}$ ($V_R$ represents a Zener voltage of a Zener diode 19a; $V_D$ represents a forward voltage drop of the diode 31a; and $V_{BE}$ represents a emitter-base voltage of the transistor 30a) which is applied to the emitter of the transistor 30a. The resulting non-conductive condition is delivered to the anode side of a diode 33a of the control circuit 20 via the resistor 32a from the collector of the transistor 30a.

Similarly, the comparator 17b is comprised of a transistor 30b, a diode 31b and a resistor 32b. In this arrangement, the transistor 30b is rendered non-conductive when the negative voltage $V_N$ of the rectifying circuit 12 which is applied to the base of this transistor becomes lower than the reference voltage $\{-V_L + V_R + V_D + V_{BE}\}$ ($V_R$ represents a Zener voltage of a Zener diode 19b; $V_D$ represents a forward voltage drop of the diode 31b; and $V_{BE}$ represents an emitter-base voltage of the transistor 30b) which is applied to the emitter of said transistor 30b. This non-conductive condition is delivered to the cathode side of a diode 33b of the control circuit 20 from the collector of the transistor 30b through the resistor 32b.

When the transistor 30a is rendered non-conductive, the current will flow in the order: ground→diode 34a→transistor 35a→transistor 35b→diode 33a→resistor 36a→low voltage power supply 18b, and thereby the control circuit 20 renders the transistors 35a and 35b conductive. Similarly, when the transistor 30b is rendered non-conductive, the current is allowed to flow in the order: low voltage power supply 18a→resistor 36b→diode 33b→transistor 35a→transistor 35b→diode 34b→ground, and thereby the control circuit 20 renders the transistors 35a and 35b conductive.

In this way, when either one of the transistors 30a and 30b is rendered non-conductive, the transistors 35a and 35b are rendered conductive, causing transistors 37a and 37b to become conductive.

As a result, these transistors 37a and 37b serve to render respective transistors 38a, 39a and 38b, 39b having Darlington connection in the changeover circuits 22a and 22b conductive, causing a switchover connection to the high voltage power supplies 21a and 21b so that their voltages are supplied to amplifying circuits 101 and 102, respectively.

As will be understood from the foregoing description, this circuit has an arrangement similar to that of the circuit shown in FIG. 2, and thus similar function and effect can be obtained.

Figure 4:
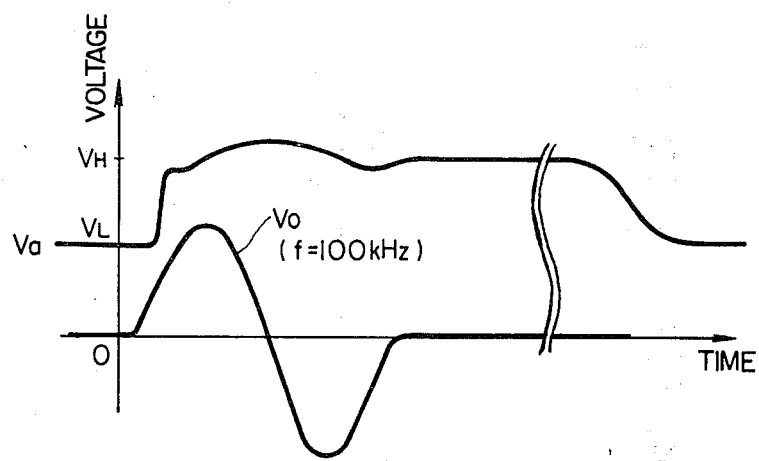
FIGS. 4 and 5 are waveshape diagrams for explaining the functions of resistors 40a, 40b and capacitors 41a, 41b in FIG. 3.
Figure 5:
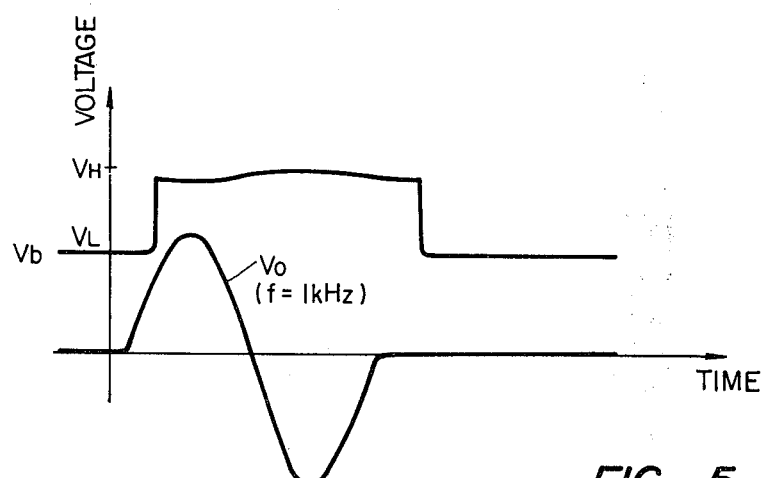

Resistors 40a, 40b and capacitors 41a and 41b which are provided on the collector side of the respective transistors 35a and 35b constitute a holding circuit. As shown in FIG. 4, this holding circuit is asigned to change the timing of responses at the time of transition from high voltage power supplies 21a, 21b over to the low voltage power supplies 18a, 18b in accordance with the frequency f of the output voltage $V_O$. FIG. 4 shows a descending waveshape of a power supply voltage $V_a$ when f=100 kHz and FIG. 5 shows a descending waveshape of a power supply voltage $V_b$ when f=1 kHz. Especially, this holding circuit serves to limit the number of changeover actions of power supply voltages when a high frequency signal is inputted to the amplifier.

In the abovesaid embodiment, arrangement is made so that both the positive and negative power supplies are changed over of their connections at the same time. It should be noted, however, the changeover of connections may be made separately for positive power supplies and negative power supplies based on the result of comparison of the respective comparators.

What is claimed is:

1. An amplifier of the power supply connection changeover type, comprising:
   a plurality of power supplies having different voltages;

amplifying means adapted to be supplied with a voltage from the power supplies;

connection changeover means for selectively connecting one of the power supplies to the amplifying means; and comparing means for comparing a reference voltage with a voltage of a signal amplified by said amplifying means, wherein the value of the reference voltage varies in accordance with variations in the voltage of at least a selected one of the power supplies;

said connection changeover means being controlled based on a result of comparison done by said comparing means.

2. An amplifier according to claim 1, wherein said comparing means controls said connection changeover means to effect changeover of connections from a power supply of a low voltage over to a power supply of a high voltage when the signal voltage level exceeds the reference voltage level and from a power supply of a high voltage to a power supply of a low voltage when the signal voltage level falls below the reference voltage level.

3. An amplifier according to claim 2, wherein said reference voltage is associated with the power supply of a low voltage so as to vary in accordance with fluctuations of said low voltage.

4. An amplifier according to claim 3, wherein said reference voltage is one obtained by subtracting a predetermined voltage from said low voltage of the power supply.

5. An amplifier according to claim 4, wherein said predetermined voltage is set by a Zener diode.

6. An amplifier according to claim 1, wherein said plurality of power supplies are comprised of balanced positive and negative power supplies, and wherein separate connection changeover means are provided for the positive power supply side and the negative power supply side.

7. An amplifier according to claim 6, wherein the two connection changeover means on the positive and the negative power supply sides are adapted to exert their changeover actions separately by said comparing means.

8. An amplifier according to claim 6, wherein the two connection changeover means are adapted to exert their changeover actions simultaneously by said comparing means.

9. An amplifier according to claim 1, wherein separate comparing means are provided for the signal voltage component on the positive side and for the signal voltage component on the negative side.

10. An amplifier according to claim 9, further comprising:

a rectifying means for extracting a signal voltage component on the positive side and a signal voltage component on the negative side and for delivering these signal component voltages to said comparing means.

11. An amplifier according to claim 10, wherein said rectifying means has an ability to serve as a bypass-filter of smoothly passing therethrough a high frequency signal component rather than a low frequency signal component.

12. An amplifier according to claim 11, wherein said rectifying means to serve as a bypass-filter comprises a capacitor connected in series to a signal pass line.

13. An amplifier according to claim 2, further comprising:

a holding means for temporarily holding a changeover instruction signal inputted into said connection changeover means from said comparing means.

14. An amplifier according to claim 13, wherein said changeover instruction signal is one intended to switch the connection of the power supplies from high voltage over to low voltage.

15. An amplifier according to claim 9, wherein said amplifying means is constructed to cover two channels and wherein the signal voltage component on the positive side and the signal voltage component on the negative side of said amplifying means for each channel are extracted and synthesized by said rectifying means, respectively.

16. An amplifier according to claim 1, wherein said signal voltage is derived at an output of said amplifying means.

17. In an amplifier of the type in which a signal amplifier is selectively supplied by high and low level power supplies and comparison means are provided to compare the signal from the signal amplifier with a reference voltage to control which of the power supplies is to be connected to the signal amplifier, the improvement for preventing saturation of the signal amplifier comprising means for varying the value of the reference voltage in accordance with variations in the voltage of the low level power supply.

18. An amplifier according to claim 17 including speed-up means for speeding up the response of the comparison means at high frequencies.

19. An amplifier according to claim 18 wherein the speed-up means comprises a high pass filter connected between the signal amplifier and the comparison means, whereby a greater portion of the output of the signal amplifier is applied to the comparison means at high frequencies thereby to cause the comparison means to switch at a point in time earlier than with low frequency signals.

20. An amplifier according to claim 17 including holding means for delaying switching from the high to low level power supplies at higher frequencies thereby to limit the number of switching changeover actions of the power supplies when a high frequency signal is inputted to the signal amplifier.

21. An amplifier of the power supply connection changeover type, comprising:

an input signal terminal adapted to be applied with an input signal of said amplifier;

an output signal terminal adapted to derive an output signal of said amplifier;

amplifying means connected between said input and output terminals for amplifying said input signal and for applying an amplified input signal to said output signal terminal as said output signal of said amplifier;

a first positive power supply;

a second positive power supply having a voltage whose absolute value is greater than an absolute value of a voltage of said first positive power supply;

a first negative power supply;

a second negative power supply having a voltage whose absolute value is greater than an absolute value of a voltage of said first negative power supply;

first connection changeover means for selectively connecting one of said first and second positive power supplies to said amplifying means;

second connection changeover means for selectively connecting one of said first and second negative power supplies to said amplifying means;

first input signal level detection means for detecting an amplitude of a postive voltage of said input signal and being comprised of a first reference voltage source having a voltage potential which varies in accordance with fluctuation of the voltage of said first positive power supply, and first comparing means for comparing the voltage potential of said first reference voltage source with a positive voltage corresponding to the positive signal voltage of said input signal; and a second input signal level detection means for detecting an amplitude of a negative voltage of said input signal and being comprised of a second reference voltage source having a voltage potential which varies in accordance with fluctuation of the voltage of said first negative power supply, and second comparing means for comparing the voltage potential of said second reference voltage source with a negative voltage corresponding to the negative signal voltage of said input signal; wherein the changeover of connection of said first and second positive power supplies to said amplifying means by said first connection changeover means from said first positive power supply over to said second positive power supply and the changeover of connection of said first and second negative power supplies of said amplifying means by said second connection changeover means from said first negative power supply over to said second negative power supply are controlled based on comparison results of said first and second comparing means of said first and second input signal level detection means which results represent that the voltages corresponding to said input signal exceed said voltage potentials of said first and second reference voltage sources.

* * * * *